(12) United States Patent
Lin

(10) Patent No.: US 8,765,499 B2
(45) Date of Patent: Jul. 1, 2014

(54) METHOD FOR MANUFACTURING LED PACKAGE

(71) Applicant: Advanced Optoelectronic Technology, Inc., Hsinchu Hsien (TW)

(72) Inventor: Hou-Te Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/895,373

(22) Filed: May 16, 2013

(65) Prior Publication Data

US 2014/0004632 A1    Jan. 2, 2014

(30) Foreign Application Priority Data

Jun. 29, 2012    (CN) .......................... 2012 1 0220867

(51) Int. Cl.
*H01L 21/00*    (2006.01)

(52) U.S. Cl.
USPC ....... 438/26; 438/124; 438/126; 257/E21.503

(58) Field of Classification Search
CPC .............................. H01L 23/043; H01L 23/18
USPC .................................................... 257/E21.501
See application file for complete search history.

(56) References Cited

U.S. PATENT DOCUMENTS

2012/0126256 A1* 5/2012 Komatsu et al. ................ 257/88

* cited by examiner

*Primary Examiner* — Cheung Lee
(74) *Attorney, Agent, or Firm* — Novak Druce Connolly Bove + Quigg LLP

(57) ABSTRACT

A method for manufacturing an LED package includes following steps. A plate is provided. The plate defines a plurality of the through holes extending from an upper surface to a bottom surface of the plate. A blue film is attached to the bottom surface of the plate and covers openings of the through holes. The blue film and an inner wall of the plate defining the through hole cooperatively define a groove. Glue doped with phosphor particle is injected into the groove. The phosphor particles are condensed to a bottom surface of the glue adjacent to the blue film. The LED chips are embedded in the grooves and positioned at upper ends of the grooves. Finally, the blue film is removed and the plate is severed to obtain a plurality of individual LED packages each including a corresponding LED chip.

11 Claims, 12 Drawing Sheets

METHOD FOR MANUFACTURING LED PACKAGE

BACKGROUND

1. Technical Field

The disclosure generally relates to a method for manufacturing an LED package, and particularly to a method for manufacturing an LED package which has a phosphor layer remote from an LED chip of the LED package.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

An LED package includes a substrate, an LED chip formed on the substrate, and a phosphor layer covering the LED chip. Generally, the phosphor layer is formed on the LED chip by injection or transfer molding and covers the LED chip directly. However, in operation, heat generated by the LED chip will affect properties of the phosphor layer, and reduce a reliability of the LED package.

What is needed, therefore, is an LED package to overcome the above described disadvantages.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

An embodiment of a method for manufacturing an LED package will now be described in detail below and with reference to the drawings.

Figure 1:
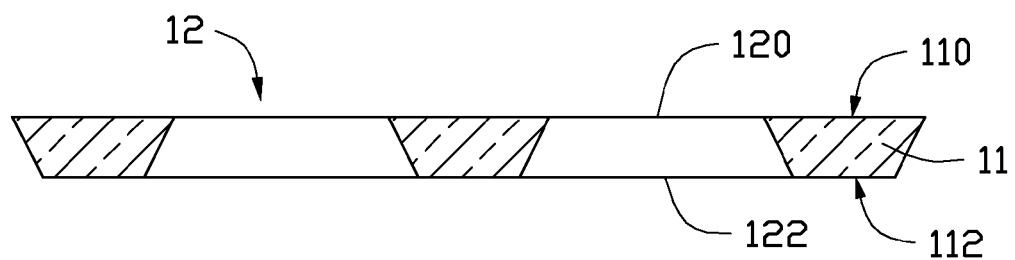
FIG. 1 is a cross-sectional view showing a first step for manufacturing an LED package in accordance with an embodiment of the present disclosure.
Figure 2:
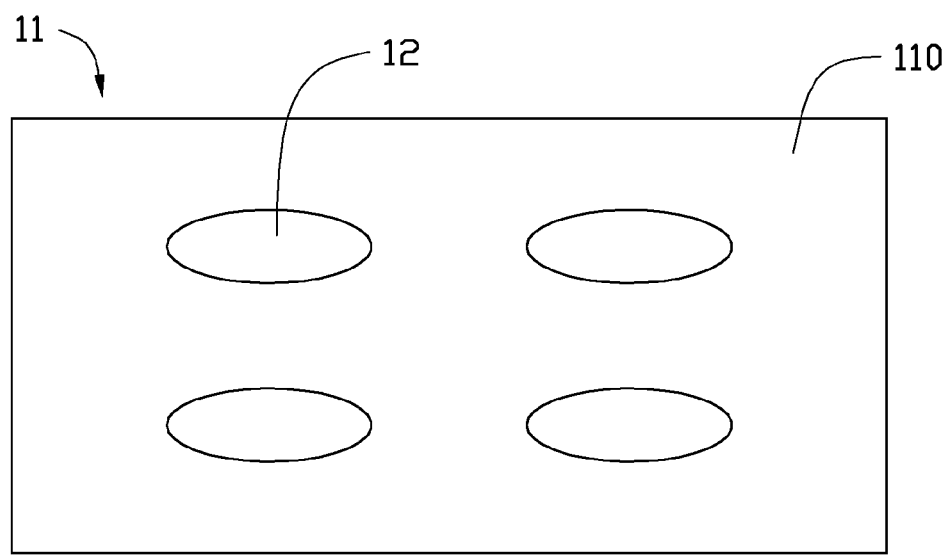
FIG. 2 is a top plan view of a plate of FIG. 1 for manufacturing the LED package.

Referring to FIGS. 1-2, a plate 11 is provided. The plate 11 includes an upper surface 110 and a bottom surface 112. A plurality of through holes 12 are defined in the plate 11 and extending from the upper surface 110 to the bottom surface 112. Each of the through holes 12 has a first opening 120 in the upper surface 110 of the plate 11 and a second opening 122 in the bottom surface 112 of the plate 11. The first opening 120 and the second opening 122 are circular, rectangular or elliptical in shape. In this embodiment, the first opening 120 and the second opening 122 are elliptical. A dimension of the through hole 12 is gradually decreased from the bottom surface 112 to the upper surface 110.

Figure 3:
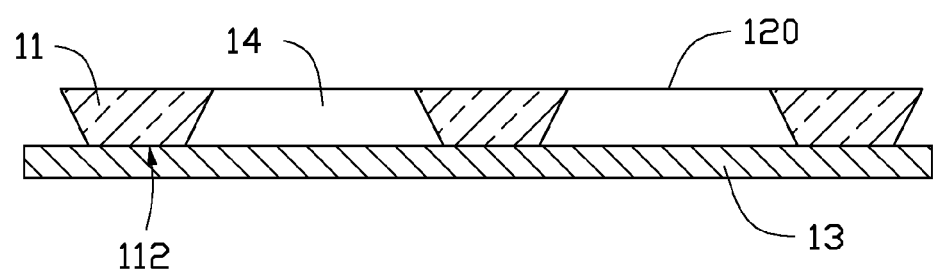
FIG. 3 is a cross-sectional view showing a second step for manufacturing the LED package in accordance with an embodiment of the present disclosure.

Referring to FIG. 3, a blue film 13 is attached on the bottom surface 112 of the plate 11 and covers the second openings 122 of the through holes 12. The blue film 13 and an inner wall of plate 11 defining the through hole 12 cooperatively define a groove 14. The groove 14 is communicated with an outer environment through the first opening 120.

Figure 4:
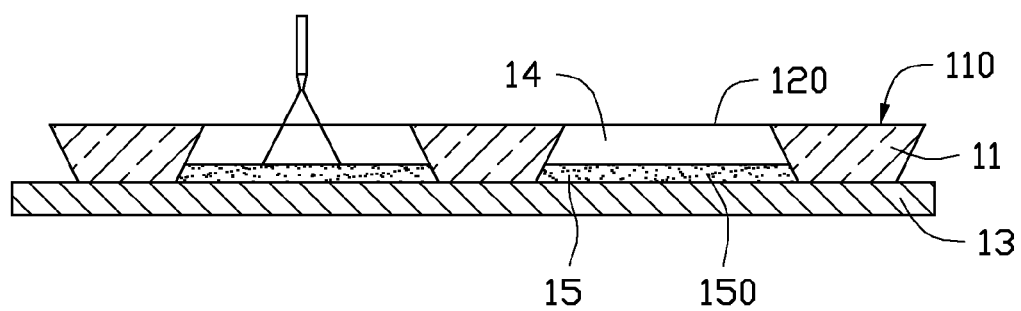
FIG. 4 is a cross-sectional view showing a third step for manufacturing the LED package in accordance with an embodiment of the present disclosure.

Referring to FIG. 4, a glue 15 is injected into the groove 14 from the first opening 120 in the upper surface 110 of the plate 11. The glue 15 is doped with phosphor particles 150. The glue 15 is positioned at a bottom end of the groove 14 and located on the blue film 13. In this embodiment, the glue 15 does not fill up the groove 14. That is, a height of the glue 15 is less than a depth of the groove 14.

Figure 5:
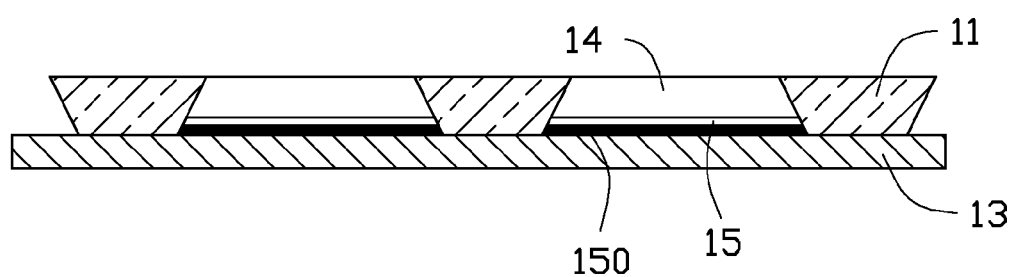
FIG. 5 is a cross-sectional view showing a fourth step for manufacturing the LED package in accordance with an embodiment of the present disclosure.

Referring to FIG. 5, the phosphor particles 150 are condensed to the bottom of the glue 15 and adjacent to the blue film 13. In this embodiment, the phosphor particles 150 are condensed to the bottom of the groove 14 by gravity or centrifugal force.

Figure 6:
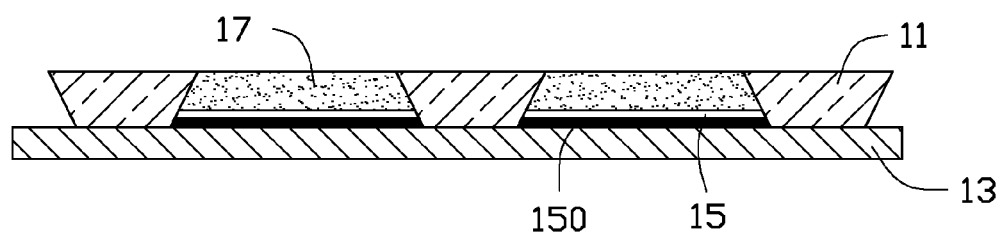
FIG. 6 is a cross-sectional view showing a fifth step for manufacturing the LED package in accordance with an embodiment of the present disclosure.
Figure 7:
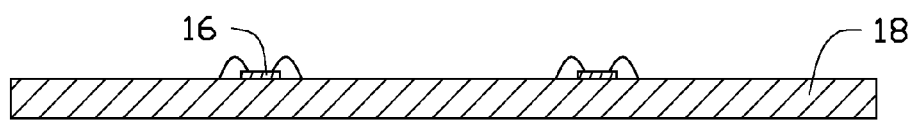
FIG. 7 is a cross-sectional view showing a sixth step for manufacturing the LED package in accordance with an embodiment of the present disclosure.
Figure 8:
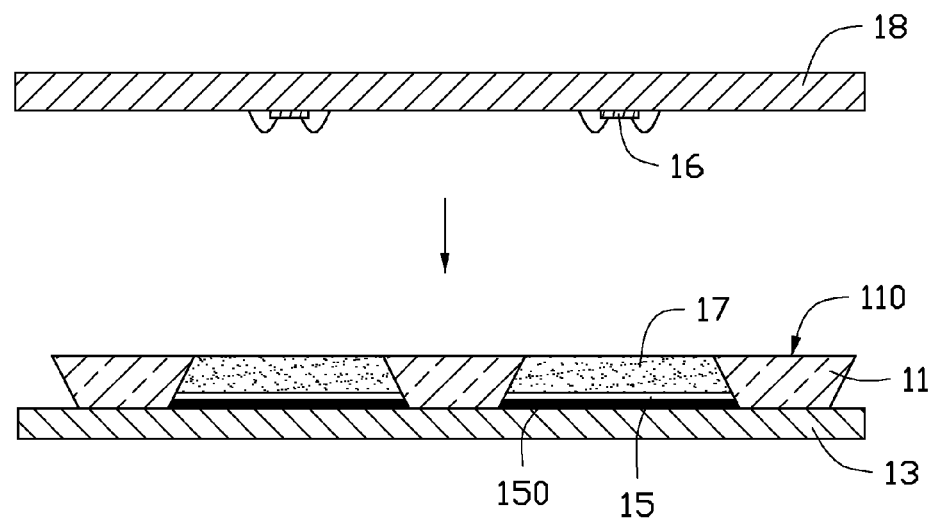
FIG. 8 is a cross-sectional view showing a seventh step for manufacturing the LED package in accordance with an embodiment of the present disclosure.
Figure 9:
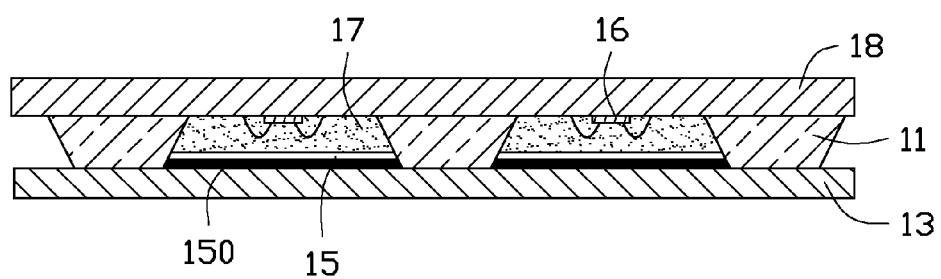
FIG. 9 is a cross-sectional view showing an eighth step for manufacturing the LED package in accordance with an embodiment of the present disclosure.

After that, LED chips 16 are embedded in the grooves 14 respectively and positioned at upper ends of the grooves 14. Before that, in this embodiment, a transparent glue 17 is firstly filled into the groove 14 until an upper surface of the transparent glue 17 is coplanar with the upper surface 110 of the plate 11, as shown in FIG. 6. Then, as shown in FIG. 7, a substrate 18 with a plurality of the LED chips 16 arranged on a surface thereof is provided. The substrate 18 has electric conductive structures (not shown), and the LED chips 16 are electrically connected with the electric conductive structures. Referring to FIGS. 8-9, the LED chips 16 on the substrate 18 are embedded into the transparent glue 17 and positioned at the upper ends of the grooves 14. The substrate 18 is attached to the upper surface 110 of the plate 11.

Figure 10:
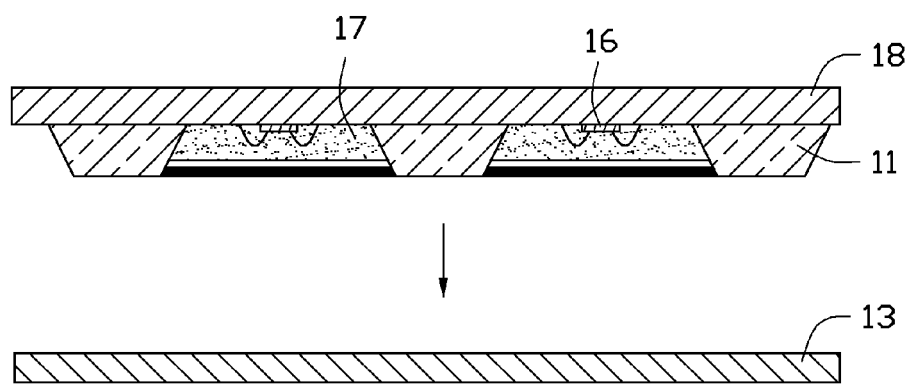
FIG. 10 is a cross-sectional view showing a ninth step for manufacturing the LED package in accordance with an embodiment of the present disclosure.

Referring to FIG. 10, the blue film 13 is removed after the glue 15 and the transparent glue 17 are solidified.

Figure 11:
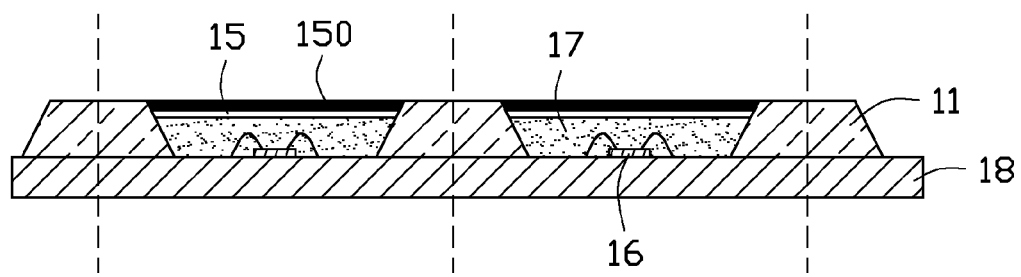
FIG. 11 is a cross-sectional view showing a tenth step for manufacturing the LED package in accordance with an embodiment of the present disclosure.
Figure 12:
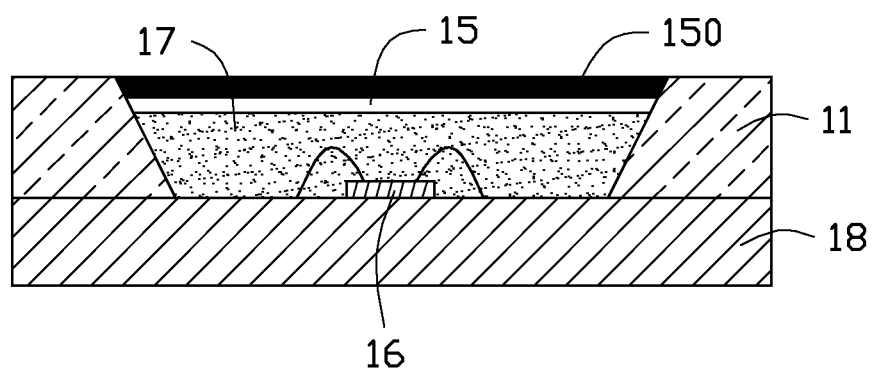
FIG. 12 is a cross-sectional view showing an eleventh step for manufacturing the LED package in accordance with an embodiment of the present disclosure.

Referring to FIG. 11, the plate 11 is severed along the broken lines whereby a plurality of individual LED packages 10 are formed, as shown in FIG. 12.

In the method described above, the phosphor particles 150 are condensed to the bottom of the glue 15 and adjacent to the blue film 13, and the LED chips 16 are positioned at the upper ends of the grooves 14. Since the LED chips 16 are separated from the phosphor particles 150 by the transparent glue 17, the heat generated by the LED chips 16 in operation will not directly heat the phosphor particles 150 and affect the properties of the phosphor particles 150. Therefore, a reliability of the LED package 10 is improved.

The plate 11 can be made of plastic or metal. If the plate 11 is made of plastic, the inner wall of the plate 11 defining the through hole 12 can be coated with a reflective film to reflect light from the LED chip 16. If the plate 11 is made of metallic materials, since metallic materials have a relatively high reflectivity, no reflective film is needed to be coated on the inner wall of the plate 11 defining the through hole 12.

In an alternative embodiment, in filling the glue 15 into the groove 14, the glue 15 can be filled into the groove 14 until an upper surface of the glue 15 is coplanar with the first surface 110 of the plate 11. After the phosphor particles 150 is condensed on the bottom of the glue 15, the LED chip 16 can be directly embedded into the glue 15 and positioned at the upper end of the groove 14. In this alternative embodiment, the transparent glue 17 is no longer necessary.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing an LED package, comprising following steps:
    providing a plate having an upper surface and a bottom surface, the plate defining a plurality of through holes extending from the upper surface to the bottom surface of the plate, each of the through holes having a first opening in the upper surface and a second opening in the bottom surface;
    attaching a blue film to the bottom surface of the plate, the blue film covering the second openings of the through holes and cooperatively defining a groove with an inner wall of the plate defining each of the through holes, the groove being communicated with an outer environment through the first opening;
    injecting a glue into the groove through the first opening, the glue being doped with phosphor particles;
    condensing the phosphor particles to a bottom surface of the glue adjacent to the blue film;
    embedding an LED chip in the groove, the LED chip being positioned at an upper end of the groove; and
    removing the blue film and severing the plate to obtain a plurality of individual LED packages.

2. The method of claim 1, wherein the first opening and the second opening of each of the through holes are circular, rectangular or elliptical in shape.

3. The method of claim 1, wherein the first opening and the second opening are elliptical, and a dimension of each of the through holes is gradually decreased from the bottom surface to the upper surface.

4. The method of claim 1, wherein a height of the glue in the groove is less than a depth of the groove.

5. The method of claim 4, wherein transparent glue is filled in the groove until an upper surface of the transparent glue is coplanar with the first surface of the plate.

6. The method of claim 1, wherein the phosphor particles are condensed to the bottom of the glue by gravity.

7. The method of claim 1, wherein the phosphor particles are condensed to the bottom of the glue by centrifugal force.

8. The method of claim 1, further providing a substrate, the LED chip being arranged on the substrate, when the LED chip is embedded into the glue, the substrate being attached to the upper surface of the plate.

9. The method of claim 1, wherein the plate is made of plastic or metal.

10. The method of claim 9, wherein the inner wall of the plate defining each of the through holes is coated with a reflective film when the plate is made of plastic.

11. The method of claim 1, wherein the LED chip is separated from the phosphor particles by the glue.

* * * * *